(12) United States Patent
Chatterjee et al.

(10) Patent No.: US 11,132,423 B2
(45) Date of Patent: Sep. 28, 2021

(54) PARTITION MATRICES INTO SUB-MATRICES THAT INCLUDE NONZERO ELEMENTS

(71) Applicant: HEWLETT PACKARD ENTERPRISE DEVELOPMENT LP, Houston, TX (US)

(72) Inventors: Soumitra Chatterjee, Bangalore (IN); Mashood Abdulla K, Bangalore (IN); Chinmay Ghosh, Bangalore (IN); Mohan Parthasarathy, Bangalore (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 209 days.

(21) Appl. No.: 16/176,848

(22) Filed: Oct. 31, 2018

(65) Prior Publication Data
US 2020/0133994 A1 Apr. 30, 2020

(51) Int. Cl.
*G06F 17/16* (2006.01)
*H03K 19/177* (2020.01)
*G06F 9/30* (2018.01)

(52) U.S. Cl.
CPC .......... *G06F 17/16* (2013.01); *G06F 9/30036* (2013.01); *H03K 19/177* (2013.01)

(58) Field of Classification Search
CPC ........ G06F 17/16; G06F 9/355; G06F 17/153; G06F 9/30036; H03K 19/177; G11C 13/0021–0028; G11C 13/004–0047; G11C 13/0069; G11C 2013/0042–0057
See application file for complete search history.

(56) References Cited

U.S. PATENT DOCUMENTS

| 9,910,827 | B2* | 3/2018 | Muralimanohar | G06F 17/16 |
| 10,430,493 | B1* | 10/2019 | Kendall | G06F 17/16 |
| 10,452,744 | B2* | 10/2019 | Agrawal | G06F 7/00 |
| 10,496,855 | B2* | 12/2019 | Muralimanohar | G06F 7/5443 |
| 10,726,096 | B2* | 7/2020 | Chatterjee | G06N 3/063 |
| 2014/0298351 | A1* | 10/2014 | Usui | G06F 17/16 718/107 |
| 2016/0140084 | A1* | 5/2016 | Daga | G06F 17/16 708/207 |
| 2016/0179750 | A1 | 6/2016 | Zhou | |

(Continued)

OTHER PUBLICATIONS

Baoyuan Liu, et al., "Sparse Convolutional Neural Networks", 2015 IEEE Conference on Computer Vision and Pattern Recognition (CVPR), Jun. 7-12, 2015, 9 pages.

(Continued)

*Primary Examiner* — Aimee Li
*Assistant Examiner* — Carlo Waje
(74) *Attorney, Agent, or Firm* — Mannava & Kang, P.C.

(57) ABSTRACT

According to examples, an apparatus may include a processor and a non-transitory computer readable medium having instructions that when executed by the processor, may cause the processor to partition a matrix of elements into a plurality of sub-matrices of elements. Each sub-matrix of the plurality of sub-matrices may include elements from a set of columns of the matrix of elements that includes a nonzero element. The processor may also assign elements of the plurality of sub-matrices to a plurality of crossbar devices to maximize a number of nonzero elements of the matrix of elements assigned to the crossbar devices.

16 Claims, 7 Drawing Sheets

(56) References Cited

U.S. PATENT DOCUMENTS

| | | | |
|---|---|---|---|
| 2018/0173677 A1* | 6/2018 | Muralimanohar | G06G 7/16 |
| 2018/0189239 A1* | 7/2018 | Nurvitadhi | G06F 9/30036 |
| 2018/0322094 A1* | 11/2018 | Friedman | G06F 3/0679 |
| 2019/0278600 A1* | 9/2019 | Frumkin | G06F 9/3885 |
| 2020/0117700 A1* | 4/2020 | Chatterjee | G06N 3/08 |
| 2020/0150923 A1* | 5/2020 | Muralimanohar | G06F 7/4876 |
| 2020/0159810 A1* | 5/2020 | Ghosh | G06N 3/08 |
| 2020/0234114 A1* | 7/2020 | Rakshit | G06F 17/16 |

OTHER PUBLICATIONS

Fang Wang, et al., "A Sparse Matrix Approach to Neural Network Training", Proceedings of ICNN'95—International Conference on Neural Networks, Nov. 27 to Dec. 1, 1995, 5 pages.

Grey Ballard, "Hypergraph Partitioning for Sparse Matrix-matrix Multiplication," Parallel Computing, 2016, 33 pages. https://www.osti.gov/servelts/purl/1303161.

Gueorgui Pironkov, et al., "Investigating Sparse Deep Neural Networks for Speech Recognition", 2015 IEEE Workshop on Automatic Speech Recognition and Understanding (ASRU), Dec. 13-17, 2015, 6 pages.

John Paul Strachan, et al., "The Dot-Product Engine (DPE): exploring high efficiency analog multiplication with memristor arrays", Dec. 11, 2015, 29 pages.

Kayaaslan et al., "Semi-two-dimensional Partitioning for Parallel Sparse Matrix-vector Multiplication," Oct. 1, 2015, 3 pages. https://ieeexplore.ieee.org/stamp/stamp.jsp?tp=&arnumber=7284436.

Louis H. Ziantz, "Run-time Optimization of Sparse Matrix-vector Multiplication on SIMD Machines," Jul. 1994, 12 pages. https://www.cs.rpi.edu/~szymansk/papers/parle94.pdf.

Miao Hu, et al., "Dot-Product Engine for Neurornorphic Computing: Programming 1T1M Crossbar to Accelerate Matrix-Vector Multiplication", Mar. 3, 2016, 7 pages.

Nathan Bell, "Sparse Matrix Representations & Iterative Solvers", Lesson 1, 2011, 25 pages. https://www.bu.edu/pasi/files/2011/01/NathanBell1-10-1000.pdf.

Nathan Bell, et al., "Implementing Sparse Matrix-Vector Multiplication on Throughput-Oriented Processors", Nov. 2009, 11 pages.

Scott Gray, et al., "GPU Kernels for Block-Sparse Weights", Dec. 6, 2017, 12 pages.

Wangdong Yang, "A Parallel Computing Method Using Blocked Format with Optimal Partitioning for SpMV on GPU," Mar. 2018, 2 pages. https://dl.acm.org/citation.cfm?3163578.3163634.

* cited by examiner

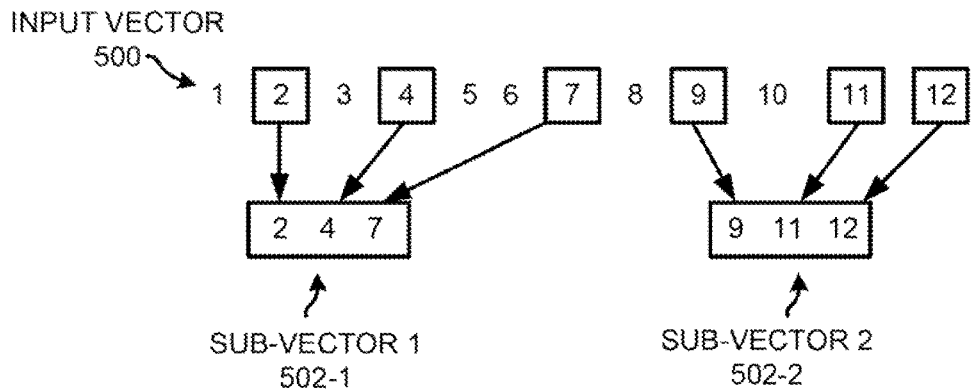
FIG. 5
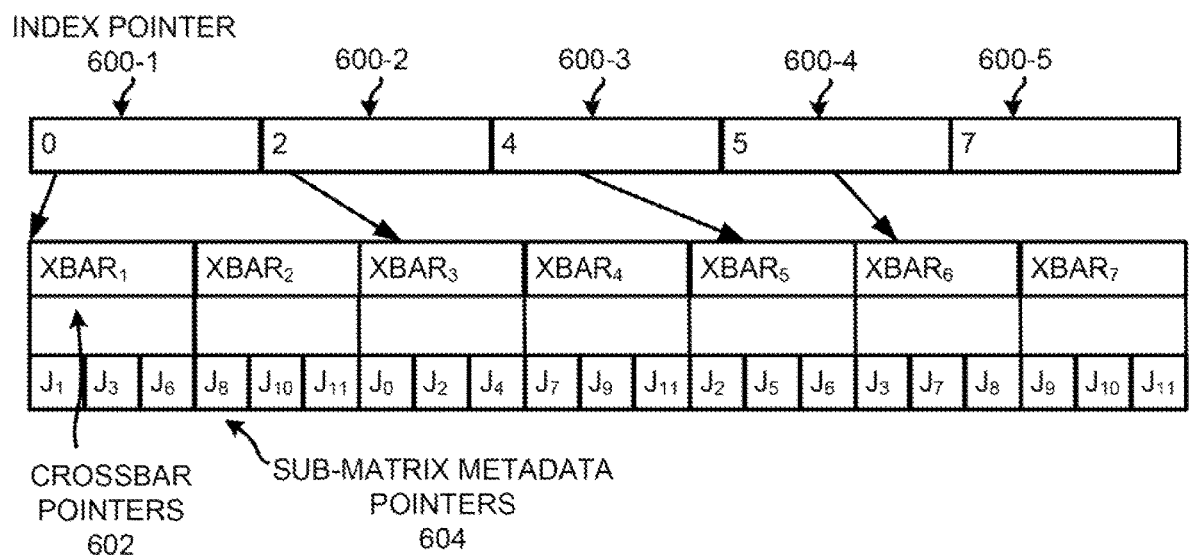
FIG. 6
FIG. 7

PARTITION MATRICES INTO SUB-MATRICES THAT INCLUDE NONZERO ELEMENTS

BACKGROUND

Matrices that include a greater number of zero elements than nonzero elements may be defined as sparse matrices. Sparse matrices may arise in numerous computational disciplines including convolutional neural networks. In addition, sparse matrix-vector multiplication (SpMV) operations may be implemented in computational science and may represent a large cost in many iterative methods for solving large-scale linear systems, eigenvalue problems, and/or convolutional neural networks. For instance, matrix-vector multiplication (SpMV) operations may arise in a wide variety of scientific, engineering, and/or deep machine learning applications. Some common examples of sparse matrices may include link matrices that may show the links from one website to another, and term occurrence matrices for words in an article against all known words in English.

BRIEF DESCRIPTION OF THE DRAWINGS

Features of the present disclosure are illustrated by way of example and not limited in the following figure(s), in which like numerals indicate like elements, in which:

FIG. 5 shows a diagram of an input vector and example sub-vectors, FIG. 6 shows a diagram of example index pointers, example crossbar pointers, and example sub-matrix metadata pointers, and FIG. 7 shows a diagram of an example matrix-vector multiplication and summation operation;

DETAILED DESCRIPTION

Figure 1:
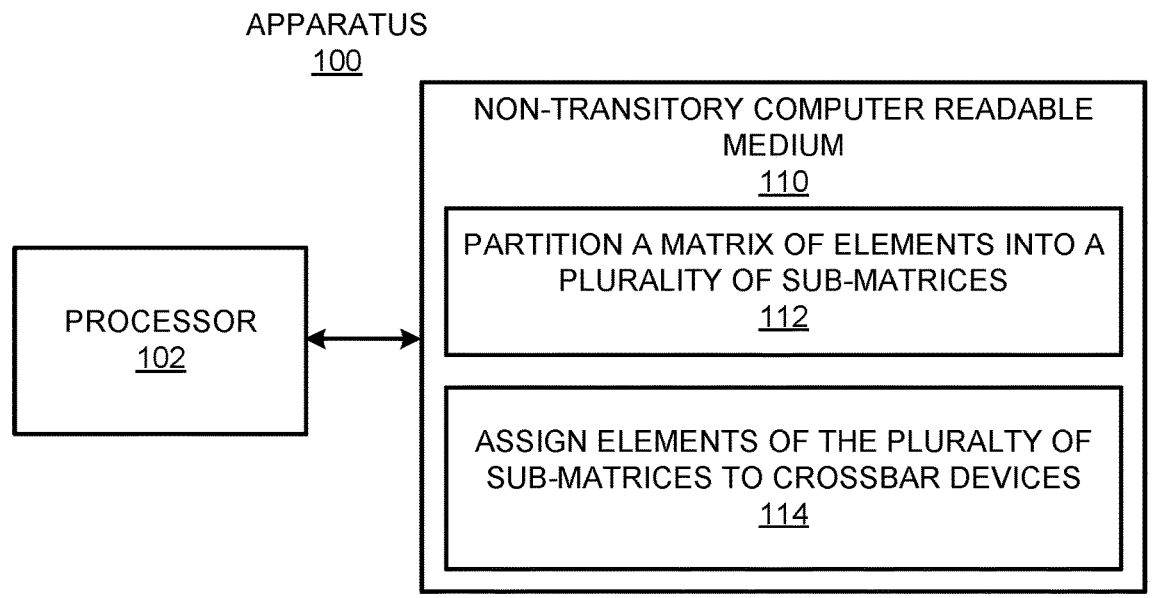
FIG. 1 shows a block diagram of an example apparatus that may partition a matrix of elements into a plurality of sub-matrices for assignment into a plurality of crossbar devices.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Matrix-vector processing techniques, such as matrix vector multiplication operations, may arise in many computing applications. For instance, matrix-vector operations may be utilized in data compression, digital data processing, neural networks, encryption and optimization, or the like. Crossbar devices, e.g., including memristors, may be used to perform matrix—vector multiplication or dot product computations. For example, an input voltage signal from each row of the crossbar device may be weighted by the conductance of the resistive devices in each column and accumulated as the current output from each column. Ideally, if wire resistances can be ignored, the current vector, I, flowing out of the crossbar array will be approximately I=VG, where V is the input voltage vector and G is the conductance matrix, including contributions from each crossbar device.

Sparse matrix structures may be defined as matrix structures that may have a significantly smaller number of nonzero elements as compared with zero elements. By way of example, the nonzero elements in a sparse matrix structure may form less than about 10% of the total number of elements in the sparse matrix structure. In other examples, the nonzero elements may form lesser-percentages of the total number of elements. Results of the execution of matrix-vector processing techniques, such as matrix-vector multiplication operations, on sparse matrix structures may thus include a large number of zero values. Computations involving whole sparse matrices may include large numbers of unnecessary computation for the zero elements. As a result, execution of matrix-vector processing operations on sparse matrix structures may result in wasted energy as well as wasted computational resources.

Disclosed herein are apparatuses and methods for partitioning a sparse matrix into sub-matrices, which may be smaller and more dense than the sparse matrix. The sub-matrices may be formed to include the nonzero elements of the sparse matrix such that execution of matrix-vector processing operations on the elements included in the sub-matrices may achieve the same computational results as the execution of matrix-vector processing operations on the elements included in the sparse matrix. Thus, for instance, a sparse matrix vector multiplication may require significantly less computational resources without compromising on accuracy.

In one regard, by partitioning a sparse matrix into denser submatrices, the number of crossbar devices to which the elements of the sub-matrices may be assigned to may be reduced and the computational complexity of matrix-vector processing operations, e.g., matrix-vector multiplication operations, using the crossbar devices may be reduced. Particularly, the sparse matrix may be partitioned into sub-matrices of columns having nonzero elements such that columns having only zero elements may be omitted from the sub-matrices and thus, only columns having nonzero elements may be assigned to the crossbar devices, which may be memristor crossbar devices.

Through implementation of the features disclosed herein, e.g., reducing the number of elements assigned, e.g., encoded, into the crossbar devices, may reduce the number of crossbar devices needed for the elements. This may result in better utilization of crossbar devices as well as saved energy consumption during computation. In addition, by omitting columns that only include zero elements, computational and energy efficiency may be improved as fewer computations may be performed to obtain a final result. In instances in which the crossbar devices are utilized for matrix vector multiplication, a large number of multiplications of zero elements may be omitted, thus resulting in fewer computations and reduced energy consumption.

Figure 2:
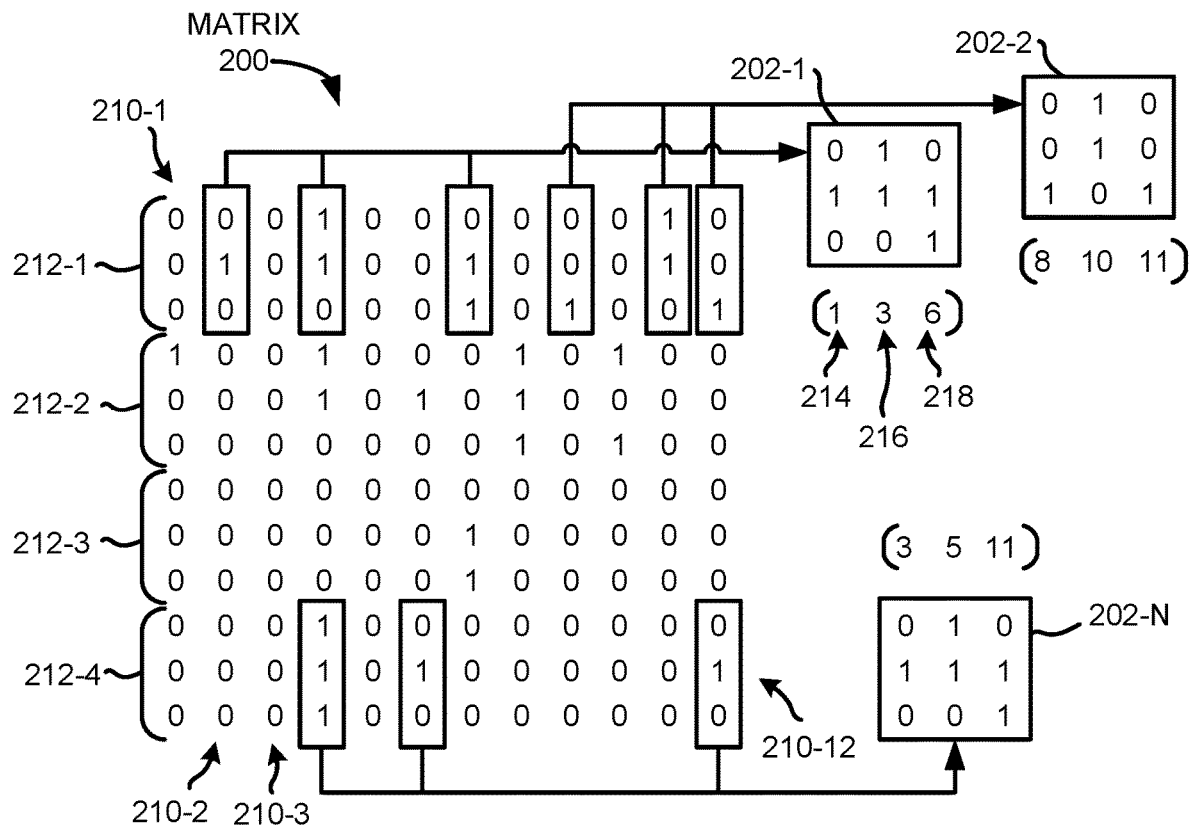
FIG. 2 shows a diagram of a matrix that the example apparatus depicted in FIG. 1 may have partitioned into a plurality of example sub-matrices.

Reference is first made to FIGS. 1 and 2. FIG. 1 shows a block diagram of an example apparatus 100 that may partition a matrix of elements into a plurality of sub-matrices for assignment into a plurality of crossbar devices. FIG. 2 shows a diagram of a matrix 200 that the example apparatus 100 depicted in FIG. 1 may have partitioned into a plurality of example sub-matrices 202-1 to 202-N. It should be understood that the apparatus 100 depicted in FIG. 1 may include additional components and that some of the components described herein may be removed and/or modified without departing from a scope of the apparatus 100 disclosed herein. In addition, it should be understood that the matrix 200 and the sub-matrices 202-1 to 202-N represents examples and the elements shown therein should not be construed as limiting the present disclosure in any respect. As such, for instance, the matrix 200 may include a larger number of elements arranged in columns and rows than is shown in the matrix 200.

The apparatus 100 may be a computing device, such as a server computer, a desktop computer, a laptop, a tablet, a smartphone, or the like. The apparatus 100 may include a processor 102 that may assign elements, e.g., values such as 1 and 0, to a memory device, such as a crossbar device. As discussed herein, the processor 102 may also implement the memory device to execute or implement matrix-vector processing operations, such as matrix vector multiplication operations based on the assigned elements. The processor 102 may be a semiconductor-based microprocessor, a central processing unit (CPU), a graphics processing unit (GPU), an application specific integrated circuit (ASIC), a field-programmable gate array (FPGA), and/or another hardware device. Although a single processor 102 is depicted, it should be understood that the apparatus 100 may include multiple processors, multiple cores, or the like, without departing from a scope of the apparatus 100.

The apparatus 100 may further include a non-transitory computer readable medium 110 that may have stored thereon machine-readable instructions that the processor 102 may execute. Examples of the machine-readable instructions are shown as instructions 112 and 114 and are further discussed below. Examples of the non-transitory computer readable medium 110 may include an electronic, magnetic, optical, or other physical storage device that contains or stores executable instructions. For example, the non-transitory computer readable medium 110 may be a Random Access memory (RAM), an Electrically Erasable Programmable Read-Only Memory (EEPROM), a hard disk, an optical disc, or other type of storage device.

The processor 102 may fetch, decode, and execute the instructions 112 to partition a matrix 200 of elements into a plurality of sub-matrices 202-1 to 202-N of elements, in which the variable "N" may represent a value greater than one. The matrix 200 may be a sparse matrix because the matrix 200 may have a significantly smaller number of nonzero elements as compared with zero elements. Each of the sub-matrices 202-1 to 202-N may include elements from a set of columns 210 of the matrix 200 that includes a nonzero element. That is, for instance, each of the sub-matrices 202-1 to 202-N may include elements from a plurality of columns 210-1 to 210-12, in which the columns from which the sub-matrices 210-1 to 210-14 may be formed includes a nonzero element. In other words, each of the sub-matrices 202-1 to 202-N may not include elements from columns that contain only zero elements.

Particularly, and as shown in FIG. 2, each of the sub-matrices 202-1 to 202-N may include elements from sets of rows 212-1 to 212-4, in which each of the sets of rows 212-1 to 212-4 may have a predefined size. In the example shown in FIG. 2, each of the sub-matrices 202-1 to 202-N may include a size of 3 rows. In addition, each of the sub-matrices 202-1 to 202-N may include a common size of columns. Thus, for instance, the sub-matrices 202-1 to 202-N may each include a 3×3 matrix. In other examples, however, the sub-matrices 202-1 to 202-N may include other sizes without departing from a scope of the present disclosure. The size of the sub-matrices 202-1 to 202-N, which may also be referenced as widths of the sub-matrices 202-1 to 202-N, may be defined as the matrix size supported by the crossbar device. By way of example, the widths of the sub-matrices 202-1 to 202-N may be defined as a dimension that may be suitable for a single matrix-vector-multiplication unit (MVMU) on a dot product engine device (e.g., the capacity of a single MVMU on the DPE device).

According to examples, to partition the matrix 200 of elements, for each predefined number of rows 212-1 to 212-4, e.g., the size supported by the crossbar device, the processor 102 may, starting from a first column 210-1, iterate through each of the columns 210-1 to 210-12 of the matrix 200 to determine whether the column includes a nonzero element. As shown in FIG. 2, the portion of the first column 210-1 in the first set of rows 212-1 does not include a nonzero element. As such, the processor 102 may omit the portion of the column 210-1 in the set of rows 212-1 from being included in a first sub-matrix 202-1. In addition, the processor 102 may move to the portion of a second column 210-2 in the first set of rows 212-1 to determine whether that portion of the second column 210-2 includes a nonzero element.

As shown, the portion of the second column 210-2 in the first set of rows 212-1 includes a nonzero element. Based on a determination that the portion of the second column 210-2 in the first set of rows 212-1 includes a nonzero element, the processor 102 may include the elements of the portion of the second column 210-2 in the first sub-matrix 202-1. The processor 102 may also record a column number 214 corresponding to the second column 210-2, e.g., a column number, in this example, column "1," corresponding to the second column 210-2 in a data store (not shown).

In addition, the processor 102 may move to the portion of a third column 210-3 in the first set of rows 212-1 to determine whether that portion of the third column 210-3 includes a nonzero element. As shown, the third column 210-3 does not include a nonzero element and thus, the processor 102 may omit that portion of the third column from the first sub-matrix 202-1. The processor 102 may move to the next portion of the columns 210-4 to 210-12 in the first set of rows 212-1 until the processor 102 identifies the next portion of the columns 210-4 to 210-12 that includes a nonzero element. In the example shown in FIG. 2, the portion of the fourth column 210-4 in the first set of rows 212-1 is shown as including nonzero elements. The processor 102 may thus include the elements of that portion of the fourth column 210-4 into the first sub-matrix 202-1 as shown in FIG. 2. In addition, the processor 102 may record a column number 216 of corresponding to the fourth column 210-4. The processor 102 may move to the portion of the columns 210-5 to 210-12 to include the portion of the column including a nonzero element into the first sub-matrix 202-1 and to record the column number 218 of that column until the processor 102 determines that the first sub-matrix 202-1 includes the predefined number of columns. In this example, based on the number of columns being included in the first sub-matrix 202-1 reaching a predefined number of columns, the processor 102 may stop including columns with a nonzero element into the first sub-matrix 202-1.

In addition, the processor 102 may form a second sub-matrix 202-2 to include the elements of the portions of a next set of columns 210-9 to 210-12 in the first set of rows 212-1 and to record the column numbers of those columns as shown in FIG. 2. The processor 102 may also form additional sub-matrices 202-3 to 202-N to include the elements of the portions of additional sets of columns 210-1 to 210-12 in the additional sets of rows 212-2 to 212-4. The processor 102 may continue to form the additional sub-matrices 202-3 to 202-N in the manners discussed above with respect to the formation of the first sub-matrix 202-1, but with other portions of the columns 210-1 to 210-12 in the next predefined sets of rows 212-2 to 212-4. In addition, the processor 102 may continue to record the column numbers corresponding to the columns 210-1 to 210-12 included in the respective sub-matrices 202-3 to 202-N.

With reference back to FIG. 1, the processor 102 may fetch, decode, and execute the instructions 114 to assign elements of the plurality of sub-matrices 202-1 to 202-N to a plurality of crossbar devices. That is, for instance, the processor 102 may send the elements to be stored in respective crossbar devices.

As the matrix 200 may have been partitioned to form the plurality of sub-matrices 202-1 to 202-N, the sub-matrices 202-1 to 202-N may include a smaller number of elements in total than those in the matrix 200, because of a fewer number of zero elements in the sub-matrices 202-1 to 202-N than in the matrix 200. The elements in the sub-matrices 202-1 to 202-N may thus be assigned to, or equivalently, encoded to, a lesser number of crossbar devices than the elements in the matrix 200. As a result, the number of crossbar devices to which the elements of the sub-matrices 202-1 to 202-N may be assigned may be relatively smaller than the number of a crossbar devices to which the elements of the whole matrix 200 may be assigned. In addition, and as discussed in greater detail herein, by having a fewer number of elements assigned to the crossbar devices, a fewer number of computations may be performed during matrix-vector processing using the elements assigned to the crossbar devices.

Figure 3A:
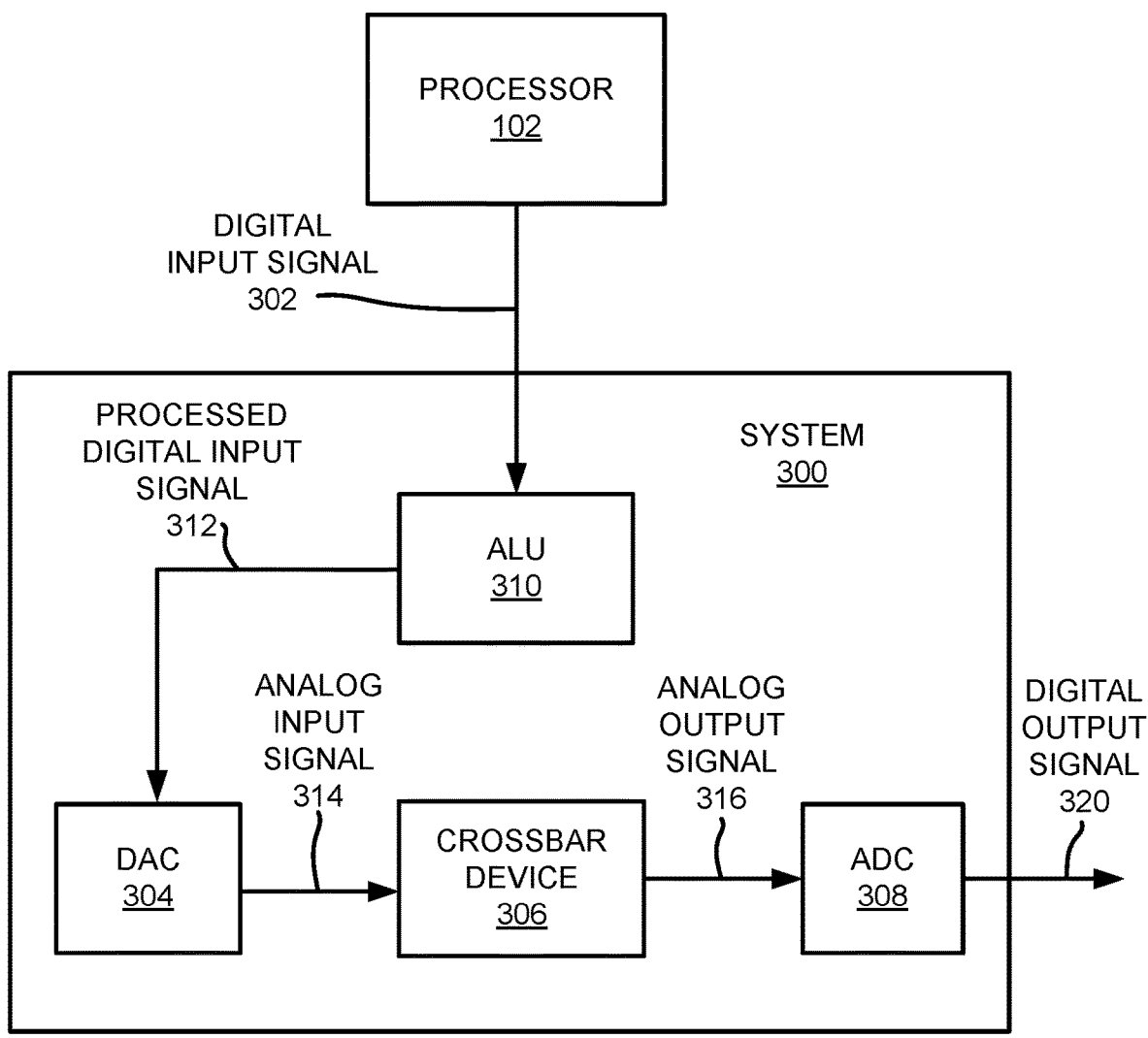
FIG. 3A shows a block diagram of an example system that may include a crossbar device to which a processor may assign the elements of a sub-matrix.

Reference is now made to FIG. 3A, which shows a block diagram of an example system 300 that may include a crossbar device 306 to which the processor 102 may assign the elements of a sub-matrix 202-1. It should be understood that the system 300 may include additional components and that some of the components described herein may be removed and/or modified without departing from a scope of the system 300 disclosed herein. For instance, although the system 300 is depicted as including a single crossbar device 306, the system 300 may include any number of crossbar devices 306.

The system 300 may be a data storage system that the processor 102 may access to store the elements of the sub-matrices 202-1 to 202-N. The processor 102 may also execute or implement the system 300 to perform matrix-vector processing on elements, e.g., values, encoded into the crossbar device 306. According to examples, the processor 102 may communicate with the system 300 via a network connection. In other examples, the processor 102 may be part of the system 300 and may directly communicate with other components in the system 300.

The apparatus 300 may also include a digital-to-analog converter (DAC) 304, the crossbar device 306, and an analog-to-digital converter (ADC) 308. The crossbar device 306 may include a crossbar array of memristors that may apply a set of operations, e.g., dot-product operations, or the like, on input signals received from the DAC 304 and may output signals corresponding to results of the applied set of operations to the ADC 308. A memristor may be defined as an electrical component that may limit or regulate a flow of electrical current in a circuit and may be programmed with the amount of charge that has previously flowed through the circuit. Memristors may be non-volatile memory cells, e.g., memristors may retain memory without power. As used herein, the dot-product operation may be an algebraic operation that may take two equal-length sequences of numbers and may return a single number. In examples, the system 300 may be implemented as a dot product engine (DPE) that may process a digital input signal 302, although the system 300 may be implemented for other processes. For instance, the system 300 may be implemented for matrix vector multiplication operations as discussed herein.

According to examples, the system 300 may include an ALU 310, which may be defined as a combinational digital electronic circuit that performs arithmetic and/or bitwise operations on integer binary numbers. The ALU 310 may receive the digital input signal 302 from the processor 102, may process the digital input signal 302 to generate a processed digital input signal 312, and may send the processed digital input signal 312 to the DAC 304. The DAC 304 may convert the processed digital input signal 312 to an analog input signal 314. The DAC 304, which may be an integrated circuit or other hardware device that may convert digital signals into analog signals, may also send the analog input signal 314 into the crossbar device 306.

The crossbar device 306 may apply an operation (or a set of operations) on the analog input signal 314, e.g., a matrix vector multiplication, a dot-product operation, etc., to generate an analog output signal 316. The crossbar device 306 may be programmed with elements, e.g., values. According to examples, the crossbar devices may include memristors, in which each of the memristors of the crossbar device 306 may limit or regulate a flow of electrical current in a circuit and may be programmed with the amount of charge that has previously flowed through the circuit. This property may be used to program the crossbar device 306 to perform a certain matrix-vector processing operation (or a set of the operations).

The crossbar device 306 may output the analog output signal 316 to the ADC 308. The ADC 308, which may be an integrated circuit or other hardware device, may convert the analog output signal 316 into a digital output signal 320.

Figure 3B:
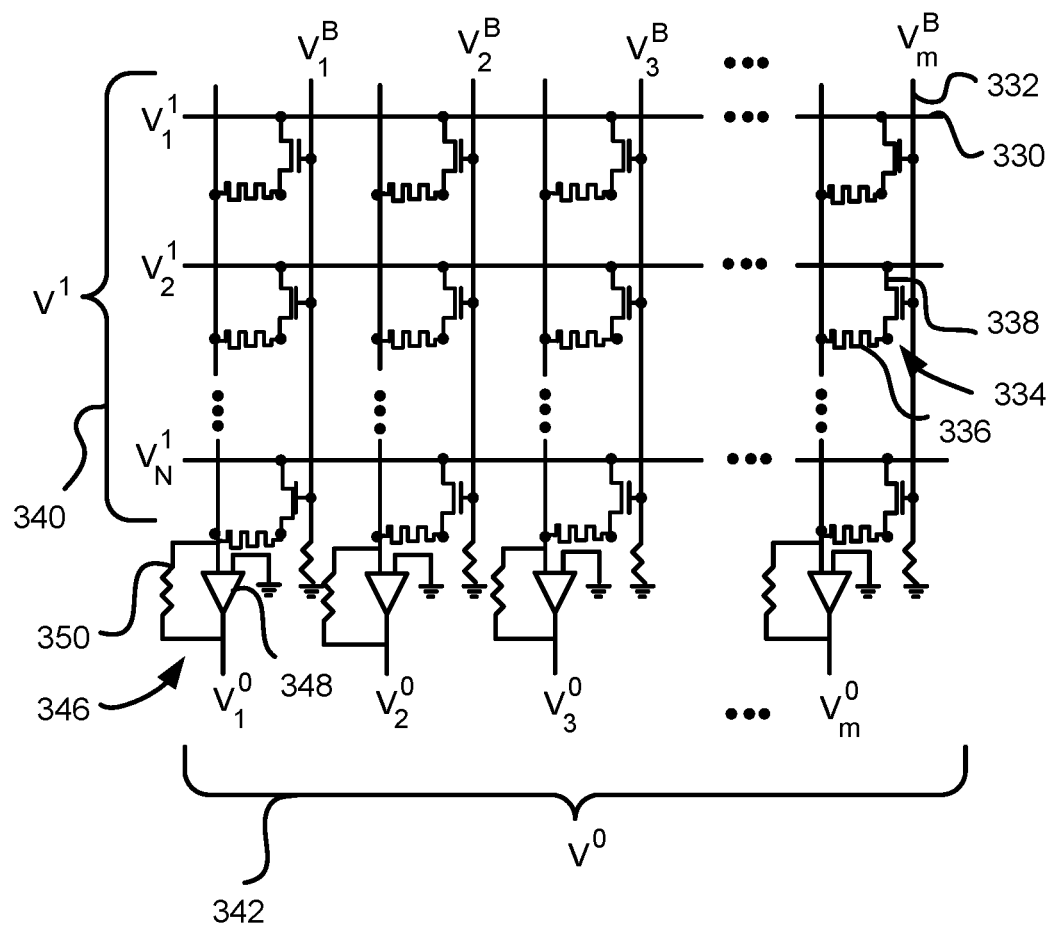
FIG. 3B shows an example crossbar device of the system depicted in FIG. 3A including a plurality of memristors.

Turning now to FIG. 3B, there is shown an example crossbar device 306 of the system 300 depicted in FIG. 3A including a plurality of memristors. The crossbar device 306 may include N row electrodes 330 and M column electrodes 332. The crossbar junctions throughout the crossbar device 306 include a memristive element 334. The memristive element 334, in one example, includes a memristor 336 and a transistor 338. The transistor 338 may be a depletion mode transistor, in the normally ON mode under zero electrical bias.

For example, the transistors 338 may include enhancement-mode metal-oxide semiconductor field-effect transistors (MOSFETs), which are normally OFF where the gate-source voltage is biased to zero volts or ground, and may be turned on by pulling the gate voltage in the direction of the drain voltage; that is, toward the VDD supply rail, which is positive for an n-channel MOSFET (NMOS) logic and negative for a p-channel MOSFET (PMOS) logic. In a depletion-mode MOSFET, the device is normally ON at zero gate-source voltage. Such devices are used as load "resistors" in logic circuits (in depletion-load NMOS logic, for example). For N-type depletion-mode devices, the threshold voltage may be about −3 V, so it may be turned OFF by pulling the gate 3 V negative (the drain, by comparison, is more positive than the source in NMOS). In a PMOS, the polarities are reversed.

The transistors 338 may be activated when programming the memristors 336 to map the mathematic matrix, which may be a much less frequent operation than a dot-product operation. Therefore, the transistors 338 may remain in their conducting state, i.e., ON state without gate bias, which may significantly reduce the total energy cost. Low resistance in the ON state of the transistors 338 may also be beneficial. In general, the ON state resistance of the transistors 338 may be lower than that of the memristors 336. When programming a selected memristor 336, all the access transistors 338 may be turned OFF by gate biasing except for the transistors 338 in the column 332 with the selected memristor 338.

The crossbar device 306 may include a vector input register or vector input 340 for applying voltages to the row electrodes 332 and a vector output register or vector output 342 for receiving output voltages resulting from current flows in the column electrodes 344. The crossbar device 306 may also include sense circuitry 346 for converting an electrical current in a column electrode 334 to a voltage. In one example, the sense circuitry 346 may include an operational amplifier 348 and a resistor 350 that may be arranged to provide a virtual ground circuit.

The crossbar device 306 may permit the use of memristors 336 having linear voltage-current characteristics for storing the matrix of conductance values $G_{ij}$ in the crossbar junctions of the array. In examples that include use of normally ON transistors 338, each of the conductance values $G_{ij}$ may be set by sequentially imposing a voltage drop over each of the crossbar junctions. For example, the conductance value $G_{2,3}$ may be set by applying a voltage equal to $V_{Row2}$ at the $2^{nd}$ row of the crossbar device 306 and a voltage equal to $V_{Col3}$ at the $3^{rd}$ column of the crossbar device 306. Note that when applying a voltage at a column electrode 332, the sense circuitry 346 for that electrode may be switched out and a voltage driver switched in. The voltage difference $V_{Row2}$-$V_{Col3}$ will generally determine the resulting conductance value $G_{2,3}$ based on the characteristics of the memristive element 334 located at the intersection. In order to isolate the memristive element 334 being programmed, according to one example, the gate voltage electrode, $V_i^B$, at each of the unselected columns is set to a non-zero bias which, for normally ON transistors 338, has the effect of turning OFF the current flow through the transistor 338. An input voltage, $V_i^I$ may then be applied to the selected row electrode 330, while unselected row electrodes are grounded or allowed to float. In this manner of programming—i.e., using transistors 338 coupled with linear memristors 336—sneak path currents may be greatly reduced or even eliminated. During dot-product engine operations, gate voltage may not be needed for any normally ON transistor 338. Only when the memristor array is being programmed to represent a new N×M matrix of values, are non-zero voltages applied to the transistor gates. However, the programming operation may occur much less frequently than a dot-product operation to the array; therefore, using normally ON transistors 338 may significantly lower the operation energy.

In some instances, the crossbar device 306 may have a one polarity input signal limitation. That is, the memristive elements 334 in the crossbar device 306 may have a one transistor 338 to one resistor 336 (1T1R) configuration as shown in FIG. 3B, which may mean that the transistor 338 may perform linearly in one voltage polarity. As a result, the crossbar device 306 may process input signals having a positive or a negative polarity, but not both. In addition or alternatively, the memristors 336 in the crossbar device 306 may have a positive matrix value limitation in which the conductance value of the memristors 336 must be positive.

Figure 4:
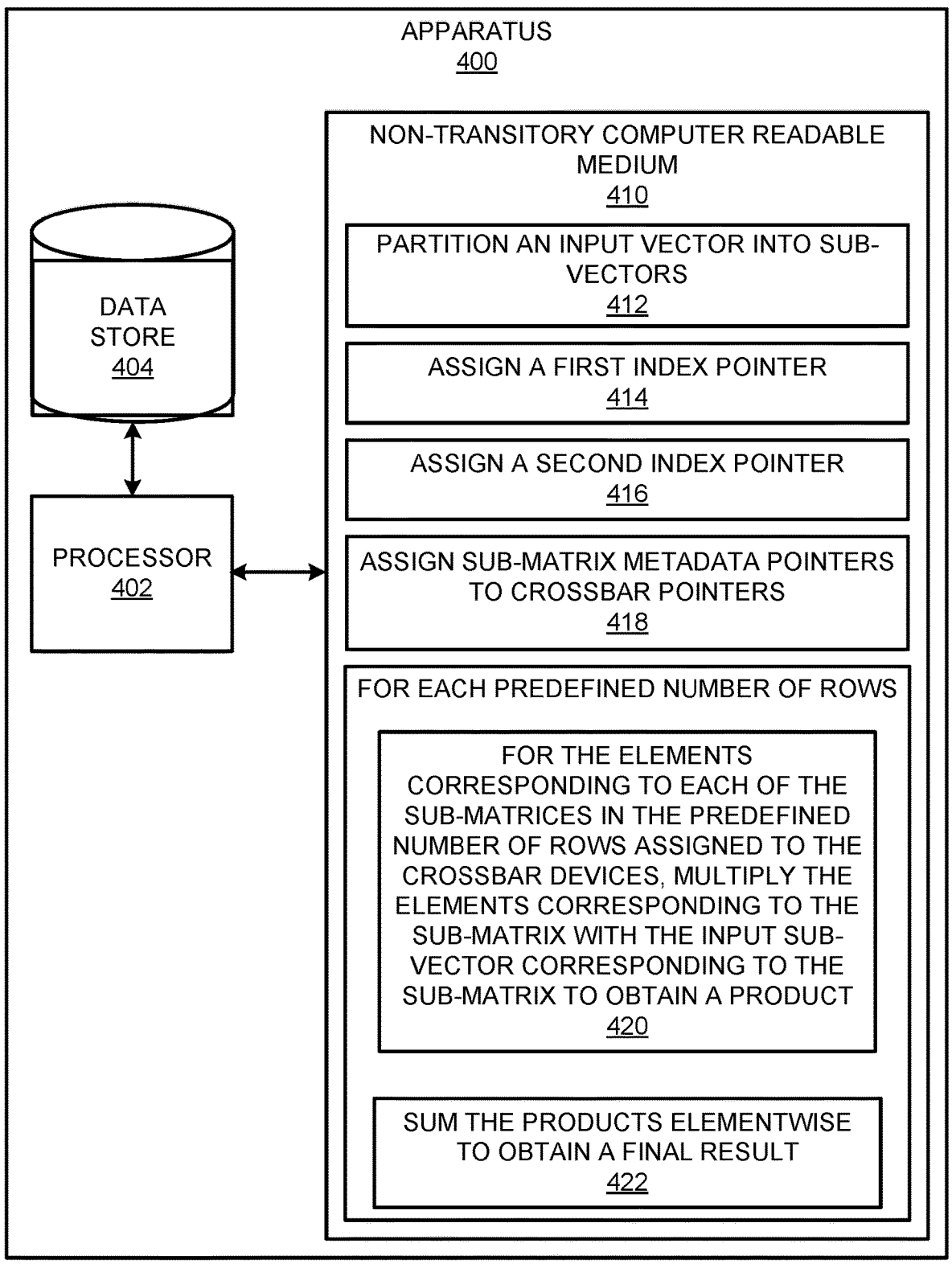
FIG. 4 shows a block diagram of an example apparatus that may reduce or minimize the amount of time and/or computational complexity of a matrix-vector multiplication operation implemented over a crossbar device.

Reference is now made to FIGS. 4-6. FIG. 4 shows a block diagram of an example apparatus 400 that may reduce or minimize the amount of time and/or computational complexity of a matrix-vector multiplication operation implemented over a crossbar device 306. FIG. 5 shows a diagram of an input vector 500 and example sub-vectors 502-1 and 502-3, which may be created using the metadata formed while partitioning the matrix 200. FIG. 6 shows a diagram of example index pointers, example crossbar pointers, and example sub-matrix metadata pointers. FIG. 7 shows a diagram of an example matrix-vector multiplication and summation operation 700. It should be understood that some of the features described herein with respect to FIGS. 4-7 may be removed and/or modified without departing from the scopes of the FIGS. 4-7 disclosed herein. The descriptions of FIGS. 4-7 are also made with reference to FIGS. 1-3B.

The apparatus 400 may be similar or equivalent to the apparatus 100 and may thus be a computing device, such as a server computer, a desktop computer, a laptop, a tablet, a smartphone, or the like. The apparatus 400 may include a processor 402 that may control operations of the apparatus 400 and may be a semiconductor-based microprocessor, a central processing unit (CPU), a graphics processing unit (GPU), an application specific integrated circuit (ASIC), a field-programmable gate array (FPGA), and/or another hardware device. Although a single processor 402 is depicted, it should be understood that the apparatus 400 may include multiple processors, multiple cores, or the like, without departing from a scope of the apparatus 400.

The apparatus 400 may also include a data store 404 that the processor 402 may access. For instance, the processor 402 may store various information, such as the matrix 200 of elements, the sub-matrices 202-1 to 202-N, the column numbers corresponding to columns included in the sub-matrices 202-1 to 202-N, etc., in the data store 404. The data store 404 may be a Random Access memory (RAM), an Electrically Erasable Programmable Read-Only Memory (EEPROM), a hard disk, an optical disc, or other type of storage device.

The apparatus 400 may further include a non-transitory computer readable medium 410 that may have stored thereon machine-readable instructions that the processor 402 may execute. Examples of the machine-readable instructions are shown as instructions 412-422 and are further discussed below. The machine-readable instructions may also include the instructions 112 and 114 discussed above with respect to FIG. 1. Examples of the non-transitory computer readable medium 410 may include an electronic, magnetic, optical, or other physical storage device that contains or stores executable instructions. For example, the non-transitory computer readable medium 410 may be a Random Access memory (RAM), an Electrically Erasable Programmable Read-Only Memory (EEPROM), a hard disk, an optical disc, or other type of storage device. In some examples, the data store 404 and the computer readable medium 410 may be an integrated data storage device.

The processor 402 may fetch, decode, and execute the instructions 412 to partition an input vector 500 into sub-vectors 502-1 and 502-2. The column numbers 214-218 included in the first sub-matrix 202-1 may be recorded as metadata. The metadata may be used as an index into the input vector 500 to form the first sub-vector 502-1 which may be multiplied with the first sub-matrix 202-1.

As shown in FIG. 5, the processor 402 may partition the input vector 500 into a first sub-vector 502-1 and a second sub-vector 502-2 using the metadata formed during matrix 200 partitioning. The first sub-vector 502-1 may include a plurality of elements from the input vector 500 that may correspond to the column numbers 214-218 recorded for the columns while forming the first sub-matrix 202-1. That is, as shown in FIG. 2, the column numbers 214-218 recorded in the sub-matrix metadata for the columns in the first sub-matrix 202-1 are 1, 3, and 6. Therefore, the input sub-vector 502-1 for the first sub-matrix 202-1 includes 2, 4, and 7. Likewise, the input sub-vector 502-2 for the second sub-matrix 202-2 includes 9, 11, and 12. Although not shown, the processor 402 may also partition the input vector 500 into additional sub-vectors for the remaining sub-matrices 202-3 to 202-N.

The processor 402 may fetch, decode, and execute the instructions 414 to assign a first index pointer 600-1 to a first predefined number of rows 212-1. The first index pointer 600-1 may point to the crossbar pointers of the sub-matrices 202-1 and 202-2 included in the first predefined number of rows 212-1. In the example shown in FIG. 1, the first predefined number of rows 212-1 may include the first sub-matrix 202-1 and the second sub-matrix 202-2. In this example, the first index pointer 600-1, which is labeled as index pointer "0" in FIG. 6, may point to a first crossbar pointer (XBAR$_1$), which may hold the first sub-matrix 202-1 formed from the first predefined set of rows 212-1. Further sub-matrices 202-1 to 202-N formed from the same set of rows 212-1 may be assigned to subsequent crossbars pointers (XBAR$_2$ onwards) until all of the sub-matrices 202-1 to 202-N are assigned. In this example, the first set of predefined rows 212-1 forms two submatrices 202-1 (in crossbar pointer XBAR$_1$) and 202-2 (in crossbar pointer XBAR$_2$).

The processor 402 may fetch, decode, and execute the instructions 416 to assign a second index pointer 600-2 to a next set of predefined number of rows 212-2. Although not explicitly shown in FIG. 1, the second predefined number of rows 212-2 may include a third sub-matrix and a fourth sub-matrix. The second index pointer 600-2 may point to the crossbar pointer which holds the first sub-matrix for the next set of rows 212-2. In this example, the second index pointer 600-2, which is labeled as index pointer "2" in FIG. 6, may point to a third crossbar pointer (XBAR$_3$) and a fourth crossbar pointer (XBAR$_4$) as the third crossbar pointer (XBAR$_3$) and the fourth crossbar pointer (XBAR$_4$) may point to crossbar units in the crossbar device 306 at which the elements of the third sub-matrix and the fourth sub-matrix may respectively be encoded.

As shown in FIG. 6, the processor 402 may further assign additional index pointers to the additional predefined numbers of rows 212-3 and 212-4 such that the additional index pointers 600-3 to 600-5 point to crossbar pointers 602 corresponding to sub-matrices included in those additional predefined numbers of rows 212-3 and 212-4. The crossbar pointer 602 sequence may indicate the crossbar identifier for each of the non-zero sub-matrices 202-1 to 202-N. The index pointer sequence may store the index into crossbar pointers that respectively hold the first sub-matrices from the predefined sets of rows 212-1 to 212-4.

The processor 402 may fetch, decode, and execute the instructions 418 to assign sub-matrix metadata pointers 604 to the crossbar pointers 602. As shown in FIG. 6, the sub-matrix metadata pointers 604 may correspond to column numbers of columns included in the submatrix assigned to crossbar pointer 602. According to examples, during execution of the crossbar device 306 to execute, for instance, a matrix-vector multiplication operation, the sub-matrix metadata pointers 604 may be used as the index into the input vector to create sub-vectors 502-1 to 502-2.

The processor 402 may fetch, decode, and execute the instructions 420 to, for each predefined number of rows 212-1 to 212-4 in the matrix 200 of elements, assign the crossbar device 306 to, for the elements corresponding to each of the sub-matrices 202-1 to 202-N in the predefined number of rows 212-1 to 212-4 assigned to the crossbar device 306, multiply the elements corresponding to the sub-matrix 202-1 with the input sub-vector 502-1 corresponding to the sub-matrix to obtain a product 700 (FIG. 7) of the sub-matrix 202-1 and the input sub-vector 502-1. As shown in FIG. 7, the elements assigned to the crossbar device corresponding to the first sub-matrix 202-1 may be multiplied with the first input sub-vector 502-1 to obtain a first product 700 of the first sub-matrix 202-1 and the first input sub-vector 502-1. In addition, the elements assigned to the crossbar device corresponding to the second sub-matrix 202-2 may be multiplied with the second input sub-vector 502-2 to obtain a second product 702 of the second sub-matrix 202-2 and the second input sub-vector 502-2.

The processor 402 may fetch, decode, and execute the instructions 422 to sum the products 700 and 702 of the sub-matrices 202-1 to 202-N and the input sub-vectors 502-1 and 502-2 elementwise to obtain a final result 704 for the predefined number of rows 212-1. The processor 402 may also obtain final results for the sub-matrices 202-3 to 202-N in the remaining predefined number of rows 212-2 to 212-4 in similar manners. That is, the processor 402 may implement the crossbar devices 306 to obtain final results for the elements corresponding to the sub-matrices in each of the predefined number of rows 212-2 to 212-4. For instance, a second final result may be obtained for the elements in the sub-matrices formed from the portions of the columns in the second predefined number of rows 212-2, a third final result may be obtained for the elements in the sub-matrices formed from the portions of the columns in the third predefined number of rows 212-3, and a fourth final result may be obtained for the elements in the sub-matrices formed from the portions of the columns in the fourth predefined number of rows 212-3.

Figure 8:
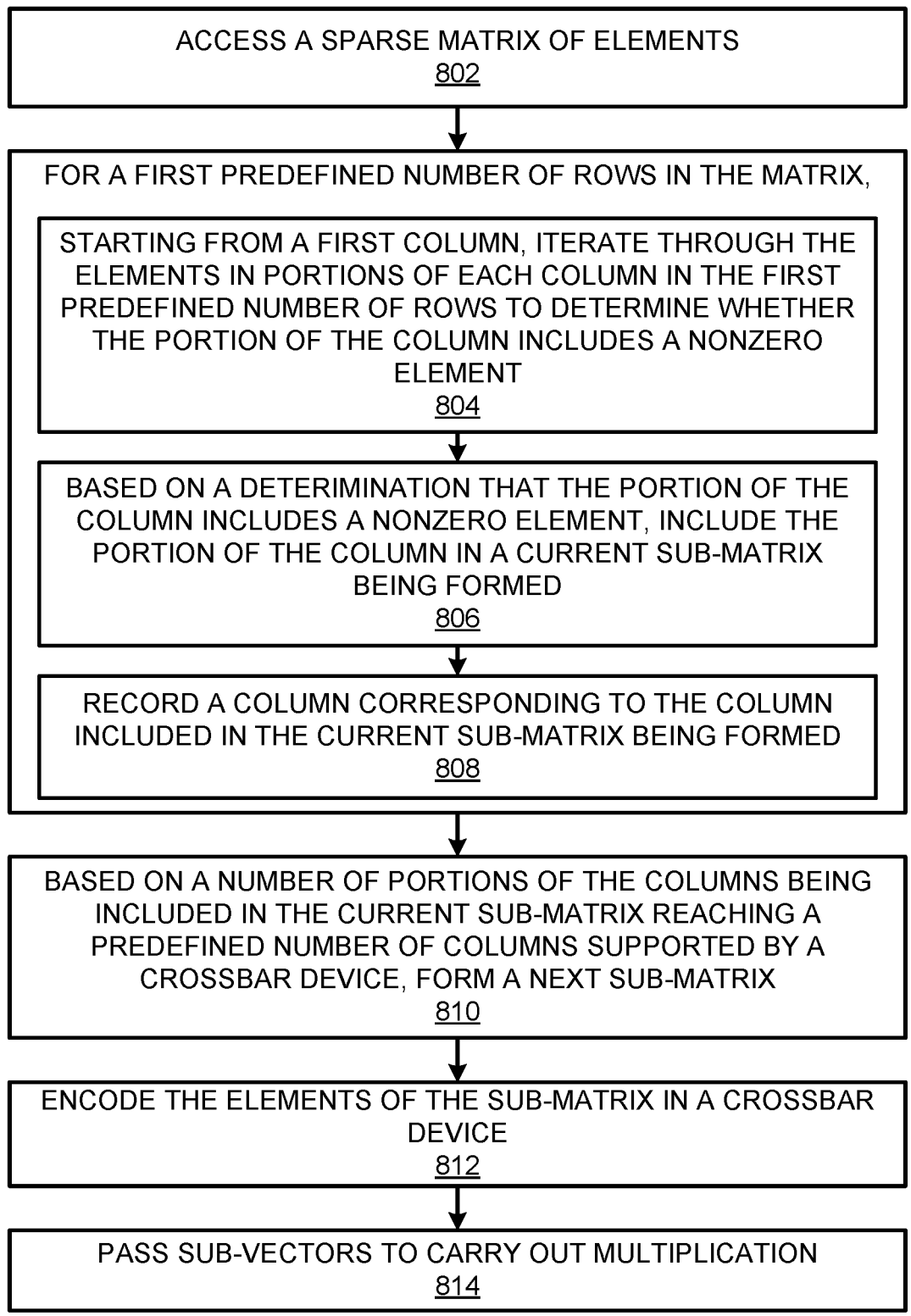
FIG. 8 depicts a flow diagram of an example method for partitioning a matrix of elements into a plurality of sub-matrices and encoding the elements in the sub-matrices in crossbar devices.
Figure 9:
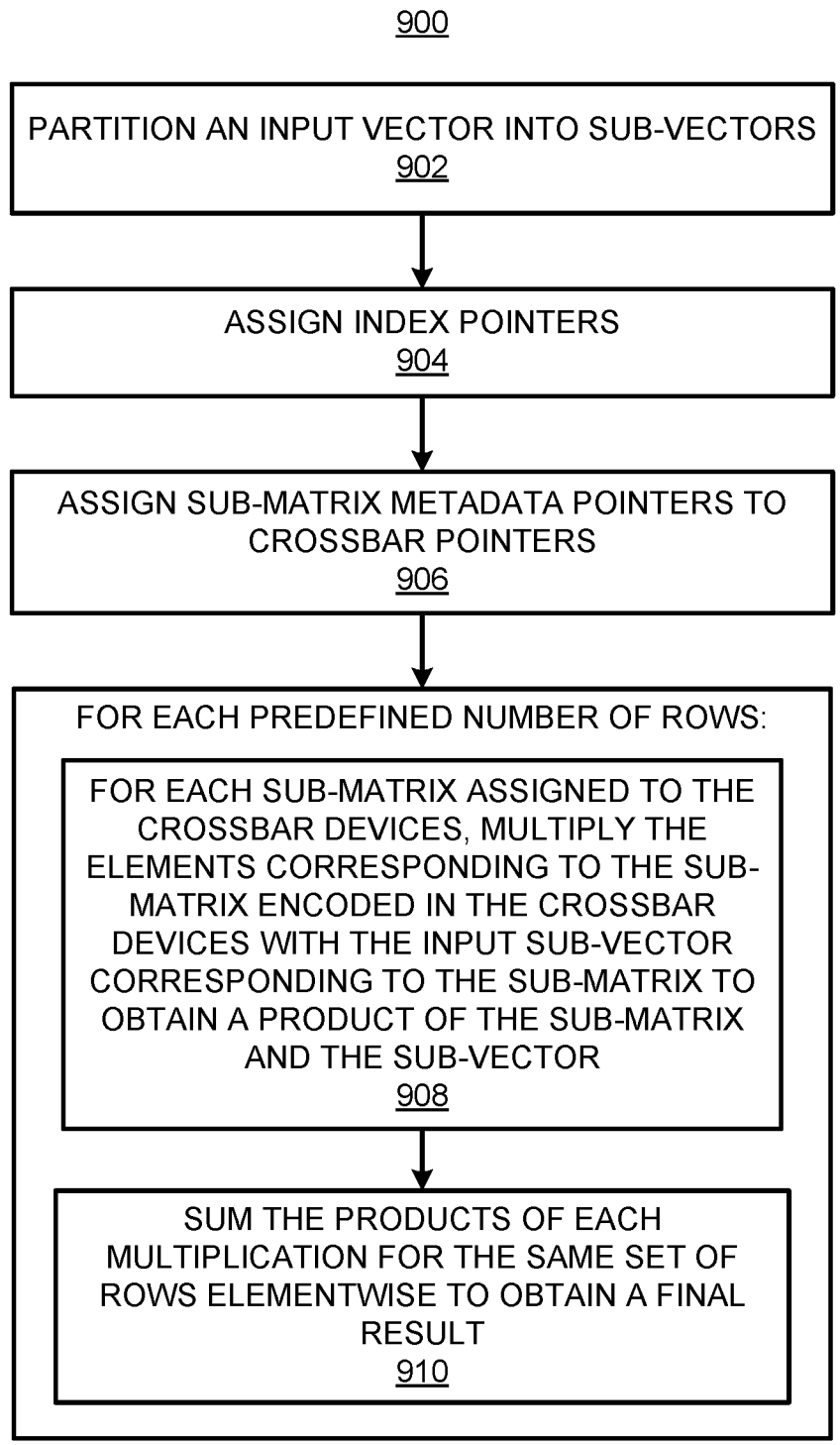
FIG. 9 depicts a flow diagram of an example method for reducing or minimizing the amount of time and/or computational complexity of a matrix-vector multiplication operation implemented over crossbar devices.

Various manners in which the processors 102, 402 may operate are discussed in greater detail with respect to the methods 800, 900 respectively depicted in FIGS. 8 and 9. Particularly, FIG. 8 depicts a flow diagram of an example method 800 for partitioning a matrix 200 of elements into a plurality of sub-matrices 202-1 to 202-N and encoding the elements in the sub-matrices 202-1 to 202-N in crossbar devices 306. FIG. 9 depicts a flow diagram of an example method 900 for reducing or minimizing the amount of time and/or computational complexity of a matrix-vector multiplication operation implemented over crossbar devices 306. It should be understood that the methods 800 and 900 may include additional operations and that some of the operations described therein may be removed and/or modified without departing from the scopes of the methods 800 and 900. The descriptions of the methods 800 and 900 are made with reference to the features depicted in FIGS. 1-7 for purposes of illustration.

With reference first to FIG. 8, at block 802, the processor 102, 402 may access a sparse matrix 200 of elements, in which the sparse matrix 200 of elements may have a plurality of rows and a plurality of columns, and each of the elements being a zero element or a nonzero element. At bock 804, for a first predefined number of rows in the sparse matrix of elements, the processor 102, 402 may, starting from a first column, iterate through the elements in portions of each column of the matrix 200 of elements in the first predefined number of rows 212-1 to determine whether the portion of the column includes a nonzero element.

At block 806, based on a determination that the portion of the column includes a nonzero element, the processor 102, 402 may include the portion of the column in a current sub-matrix 202-1 being formed. In addition, for the current sub-matrix being formed, based on a determination that the portion of the column does not include a nonzero element, the processor 102, 402 may omit the portion of the column from being included in the current sub-matrix 202-1 and may move to a next column.

At block 808, the processor 102, 402 may record a column number 214 corresponding to the column included the current sub-matrix 202-1 being formed.

At block 810, based on a number of portions of the columns being included in the current sub-matrix 202-1 reaching a predefined number of columns supported by a crossbar device 306, forming, by the processor 102, 402, a next sub-matrix 202-2. The processor 102, 402 may form the next sub-matrix 202-2 through implementation of blocks 804-808 in a next set of columns in the first predefined number of rows 212-1. At block 812, the processor 102, 402 may encode the elements of the first sub-matrix 202-1 and the next sub-matrix 202-2 into respective crossbar devices 306. At block 814, the processor 102, 402 may also pass sub-vectors 502-1 and 502-2 to carry out multiplication. As discussed above, the crossbar devices 306 may be memristive devices.

Turning now to FIG. 9, at block 902, the processor 102, 402 may partition an input vector 500 into sub-vectors 502-1 and 502-2 using the metadata created for the sub-matrices 202-1 to 202-N while partitioning as discussed herein. Each of the sub-vectors 502-1 and 502-2 may correspond to a sub-matrix 202-1 and 202-2 and each of the sub-vectors 502-1 and 502-2 may include a plurality of elements from an input vector corresponding to the column numbers 214-218 recorded for the columns in the sub-matrix 202-1, 202-2 corresponding to the sub-vector 502-1, 502-2. The processor 102, 402 may execute block 902 after execution of the method 800.

At block 904, the processor 102, 402 may assign index pointers 600-1 to 600-5 the predefined number of rows 212-1 to 212-4. That is, the processor 102, 402 may assign a first index pointer 600-1 to the first predefined number of rows 212-1, in which the first index pointer 600-1 may point to crossbar pointers 602 of the sub-matrices 202-1, 202-2 formed from portions of columns in the first predefined number of rows. In addition, the processor 102, 402 may assign a second index pointer 600-2 to a second predefined number of rows 212-2, the second index pointer 600-2 pointing to crossbar pointers 602 of the sub-matrices formed from portions of columns in the second predefined number of rows 212-2. The processor 102, 402 may also assign additional index pointers 600-3 pointing to crossbar pointers 602 of the sub-matrices formed from portions of columns in the additional predefined number of rows 212-3, 212-4.

At block 906, the processor 102, 402 may assign sub-matrix metadata pointers 604 to the crossbar pointers 602, in which the sub-matrix metadata pointers 604 may correspond to column numbers of columns included in the crossbar pointers 602.

At block 908, the processor 102, 402 may, for each of the sub-matrices 202-1 to 202-N in the first predefined number of rows 212-1 assigned to the crossbar devices, multiply the elements corresponding to the sub-matrix 202-1 encoded in the crossbar device with the input sub-vector 502-1 corresponding to the sub-matrix 202-1 to obtain a product 700 for the sub-matrix 202-1 and the input sub-vector 502-1. In addition, at block 910, the processor 102, 402 may sum the products of each multiplication for the same set of rows 212-1 elementwise to obtain a final result 704.

Some or all of the operations set forth in the methods 800 and 900 may be contained as utilities, programs, or subprograms, in any desired computer accessible medium. In addition, the methods 800 and 900 may be embodied by computer programs, which may exist in a variety of forms. For example, some operations of the methods 800 and 900 may exist as machine readable instructions, including source code, object code, executable code or other formats. Any of the above may be embodied on a non-transitory computer readable storage medium.

Examples of non-transitory computer readable storage media include computer system RAM, ROM, EPROM, EEPROM, and magnetic or optical disks or tapes. It is therefore to be understood that any electronic device capable of executing the above-described functions may perform those functions enumerated above.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A method comprising,
   accessing, by a processor, a sparse matrix of elements, the sparse matrix of elements having a plurality of rows and a plurality of columns, and each of the elements being a zero element or a nonzero element;
   for a first predefined number of rows in the sparse matrix of elements, by the processor:
      starting from a first column, iterating through the elements in portions of each column of the matrix of elements in the first predefined number of rows to determine whether the portion of the column includes a nonzero element;
      based on a determination that the portion of the column includes a nonzero element, including the portion of the column in a current sub-matrix being formed;
      recording a column number corresponding to the column included the current sub-matrix being formed; and based on a number of portions of the columns being included in the current sub-matrix reaching a predefined number of columns supported by a crossbar device, forming, by the processor, a next sub-matrix; and encoding the elements of the first sub-matrix and the next sub-matrix in respective crossbar devices.

2. The method of claim 1, further comprising:
for the current sub-matrix being formed, based on a determination that the portion of the column does not include a nonzero element, omitting the portion of the column from being included in the current sub-matrix and moving to a next column.

3. The method of claim 1, further comprising:
partitioning an input vector into sub-vectors, each of the sub-vectors corresponding to a sub-matrix, and each of the sub-vectors formed by indexing column positions of the sub-matrix in the sparse matrix of elements.

4. The method of claim 3, further comprising:
for each of the sub-matrices in the first predefined number of rows, assigning the crossbar devices to multiply the elements corresponding to the sub-matrix encoded in the crossbar devices with the input sub-vector corresponding to the sub-matrix to obtain a product for the sub-matrix and the input sub-vector; and
summing the products of the sub-matrices and the input sub-vectors elementwise to obtain a final result.

5. The method of claim 1, further comprising:
partitioning the sparse matrix into the plurality of sub-matrices to each include a predefined number of the plurality of rows and a predefined number of columns.

6. An apparatus comprising:
a processor; and
a non-transitory computer readable medium on which is stored instructions that when executed by the processor, are to cause the processor to:
access a sparse matrix of elements, the sparse matrix of elements having a plurality of rows and a plurality of columns, and each of the elements being a zero element or a nonzero element;
for a first predefined number of rows in the sparse matrix of elements:
start from a first column, iterate through the elements in portions of each column of the matrix of elements in the first predefined number of rows to determine whether the portion of the column includes a nonzero element;
based on a determination that the portion of the column includes a nonzero element, include the portion of the column in a current sub-matrix being formed;
record a column number corresponding to the column included the current sub-matrix being formed; and
based on a number of portions of the columns being included in the current sub-matrix reaching a predefined number of columns supported by a crossbar device, form, by the processor, a next sub-matrix; and
encode the elements of the first sub-matrix and the next sub-matrix in respective crossbar devices.

7. The apparatus of claim 6, wherein the instructions are further to cause the processor to:
for the current sub-matrix being formed, based on a determination that the portion of the column does not include a nonzero element, omit the portion of the column from being included in the current sub-matrix and moving to a next column.

8. The apparatus of claim 6, wherein the instructions are further to cause the processor to: partition an input vector into sub-vectors, each of the sub-vectors corresponding to a sub-matrix, and each of the sub-vectors formed by indexing column positions of the sub-matrix in the sparse matrix of elements.

9. The apparatus of claim 8, wherein the instructions are further to cause the processor to: for each of the sub-matrices in the first predefined number of rows, assign the crossbar devices to multiply the elements corresponding to the sub-matrix encoded in the crossbar devices with the input sub-vector corresponding to the sub-matrix to obtain a product for the sub-matrix and the input sub-vector; and
sum the products of the sub-matrices and the input sub-vectors elementwise to obtain a final result.

10. The apparatus of claim 6, wherein the instructions are further to cause the processor to:
partition the sparse matrix into the plurality of sub-matrices to each include a predefined number of the plurality of rows and a predefined number of columns.

11. The apparatus of claim 6, wherein the crossbar device comprises a memristor crossbar device.

12. A non-transitory computer readable medium on which is stored machine readable instructions that when executed by a processor, cause the processor to:
access a sparse matrix of elements, the sparse matrix of elements having a plurality of rows and a plurality of columns, and each of the elements being a zero element or a nonzero element;
for a first predefined number of rows in the sparse matrix of elements:
start from a first column, iterate through the elements in portions of each column of the matrix of elements in the first predefined number of rows to determine whether the portion of the column includes a nonzero element;
based on a determination that the portion of the column includes a nonzero element, include the portion of the column in a current sub-matrix being formed;
record a column number corresponding to the column included the current sub-matrix being formed; and
based on a number of portions of the columns being included in the current sub-matrix reaching a predefined number of columns supported by a crossbar device, form, by the processor, a next sub-matrix; and
encode the elements of the first sub-matrix and the next sub-matrix in respective crossbar devices.

13. The non-transitory computer readable medium of claim 12, wherein the instructions are further to cause the processor to:
for the current sub-matrix being formed, based on a determination that the portion of the column does not include a nonzero element, omit the portion of the column from being included in the current sub-matrix and moving to a next column.

14. The non-transitory computer readable medium of claim 12, wherein the instructions are further to cause the processor to:
partition an input vector into sub-vectors, each of the sub-vectors corresponding to a sub-matrix, and each of the sub-vectors formed by indexing column positions of the sub-matrix in the sparse matrix of elements.

15. The non-transitory computer readable medium of claim 14, wherein the instructions are further to cause the processor to:
for each of the sub-matrices in the first predefined number of rows, assign the crossbar devices to multiply the elements corresponding to the sub-matrix encoded in the crossbar devices with the input sub-vector corresponding to the sub-matrix to obtain a product for the sub-matrix and the input sub-vector; and sum the products of the sub-matrices and the input sub-vectors elementwise to obtain a final result.

16. The non-transitory computer readable medium of claim 12, wherein the instructions are further to cause the processor to:

partition the sparse matrix into the plurality of sub-matrices to each include a predefined number of the plurality of rows and a predefined number of columns.

* * * * *